United States Patent [19]

Gimpelson et al.

[11] Patent Number: 4,652,812

[45] Date of Patent: Mar. 24, 1987

[54] ONE-SIDED ION MIGRATION VELOCITY MEASUREMENT AND ELECTROMIGRATION FAILURE WARNING DEVICE

[75] Inventors: George E. Gimpelson, Indialantic; Elias W. George, Indian Harbour Beach, both of Fla.

[73] Assignee: Harris Corporation, Melbourne, Fla.

[21] Appl. No.: 675,221

[22] Filed: Nov. 27, 1984

[51] Int. Cl.[4] ............................................. G01R 31/26
[52] U.S. Cl. .............................. 324/65 R; 324/158 D;
357/65; 357/68
[58] Field of Search .......................... 324/65 R, 158 D;
29/574; 357/1, 68, 71

[56] References Cited

U.S. PATENT DOCUMENTS

| 3,197,724 | 7/1965 | Marsh | 339/97 C |
| 3,374,112 | 3/1968 | Danon | 427/10 |
| 3,474,530 | 10/1928 | Ainslie et al. | 29/825 |
| 3,851,245 | 11/1974 | Baker et al. | 324/65 R |
| 3,974,443 | 8/1976 | Thomas | 324/64 |
| 3,983,479 | 9/1976 | Lee et al. | 324/158 R |
| 4,126,824 | 11/1978 | Thornburg et al. | 324/62 |
| 4,483,629 | 11/1984 | Schwarz et al. | 324/65 R X |

FOREIGN PATENT DOCUMENTS 141659 5/1980 Japan .
14069 1/1983 Japan ............................... 324/158 R

OTHER PUBLICATIONS

"Electromigration in Thin Gold Films on Molybdenum Surface"; Blech and Kinsbron, Thin Solid Films, vol. 25, pp. 327-334, 1975.
"Electromigration-Induced Failure by Edge Displacement in Fine-Line Aluminum-0.5% Copper Thin Film Conductors"; English and Kinsbron; Journal of Applied Physics, vol. 54, pp. 268-274, Jan. 1983.

Primary Examiner—Reinhard J. Eisenzopf
Assistant Examiner—Stephen M. Baker
Attorney, Agent, or Firm—Barnes & Thornburg

[57] ABSTRACT

Cathode migration is reduced by increasing the width of the cathode at its leading edge compared to the width of the anode at its leading edge. Electromigration to a specific degree may be measured by placing an additional conductor connected to the anode portion of the base conductor and separated from the anode by the base conductor. A rapid change in resistance can be sensed as the anode electrically migrates past the additional conductor.

13 Claims, 3 Drawing Figures

ONE-SIDED ION MIGRATION VELOCITY MEASUREMENT AND ELECTROMIGRATION FAILURE WARNING DEVICE

BACKGROUND AND SUMMARY OF THE INVENTION

The present invention relates generally to electromigration sensors and more specifically to an improved electromigration velocity sensor and electromigration failure warning device.

The effect that scratch marks on metal lines underwent current induced migration was incorporated into an edge displacement method by Blech and Kinsbron as discussed in "Thin Solid Films," Vol. 25, pages 327, 1975. This method was refined to produce the device of FIG. 1 which was reported by English and Kinsbron in the Journal of Applied Physics, Vol. 54, page 268 in 1983. The electromigration detector of FIG. 1 includes a substrate for example, a silicon, covered by an insulative layer of silicon dioxide and silicon nitride. On the top silicon nitride layer is a first conductive layer having a low electron migration rate. This layer may be for example, a titanium-nitride alloy. Placed on the titanium-nitride alloy is a cathode and an anode electrode spaced from each other and of a material having a higher electromigration rate. Such materials for the cathode and anode may be for example, aluminum. A potential is applied to the cathode and anode and electrons travel from the cathode through the tungsten-nitride alloy to the anode. Due to the high conductivity and electromigration rate of aluminum, the electrons are injected from the transition portion of the tungsten-nitride alloy into the aluminum. This anode edge then migrates to the right in FIG. 1 using the aluminum as a material source. The edge displacement of the aluminum anode is interpreted as the average aluminum atom velocity. Its migration velocity is determined electrically by measuring the change of resistance between the cathode and the anode. This change of resistance results from the increased length of the tungsten nitride path since the intermediate section migrates to the right as the anode recedes to the right.

Although migration of the anode is prefered because of the ordered manner in which the atomic migration occurs, some movement of the cathode also occurs. The movement of the cathode undesirably effects the measurement ability of the migration velocity.

Electromigration and its relationship to conductor lifetime is discussed in U.S. Pat. No. 3,474,530.

Thus, it is an object of the present invention to provide an improved electromigration velocity sensor which overcomes the problem of the cathode migration.

Another object of the present invention is to provide an electromigration failure warning device.

These and other objects of the invention are attained by providing an improved cathode structure which reduces cathode migration by reducing current density. This is achieved by providing the cathode structure to have a substantially larger transverse width adjacent to the transition or intermediate portion of the first conductive layer compared to the transverse width of the anode structure adjacent to the intermediate portion of the first conductor. The improved electromigration velocity sensor can also be used as an electromigration failure warning device by providing an additional conductor which contacts the anode portion of the first conductor and is separated from the anode by the first conductor. This contact point is substantially adjacent to the intermediate or transition portion of the first conductor. A failure warning is provided by detecting electromigration of the anode conductor past the additional conductor by detecting the rapid change of resistance between the anode conductor and the additional conductor. The additional conductor may include a plurality of conductors which are connected to the anode portion of the first conductor at spaced points along the migration axis of the device. A single contact pad interconnects the additional conductors or fingers and one of the plurality of fingers may be selected with the others being disconnected from the common pad for example, by laser cutting.

Other objects, advantages and novel features of the present invention will become apparent from the following detailed description of the invention when considered in conjunction with the accompanying drawings.

DETAILED DESCRIPTION OF THE DRAWINGS

Figure 1:
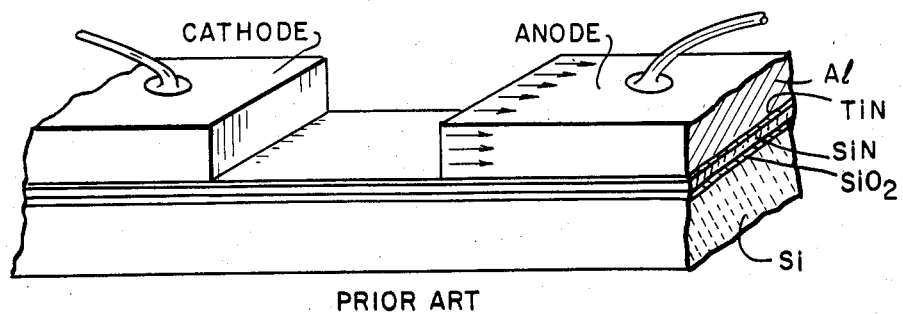
FIG. 1 is a perspective view of a migration velocity sensor of the prior art.
Figure 2:
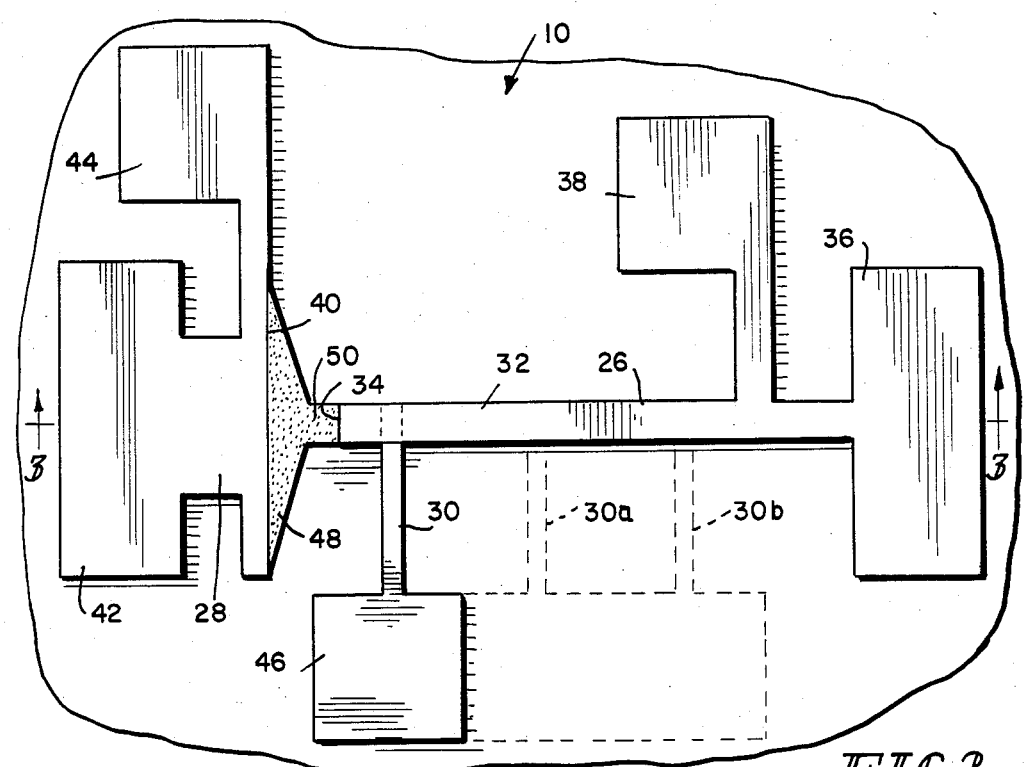
FIG. 2 is a plan view of an electromigration velocity sensor and failure warning device incorporating the principles of the present invention.
Figure 3:
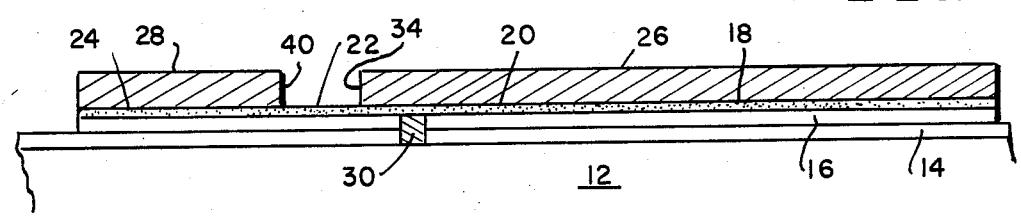
FIG. 3 is a cross-sectional view taken along lines III—III of FIG. 2.

An electromigration sensor 10 is illustrated in FIGS. 2 and 3 as lying on a substrate 12 having insulative layers 14 and 16. As in FIG. 1, the substrate 12 may be silicon with the insulative layers 14 and 16 being silicon dioxide and silicon nitride respectively. Sensor 10 includes a first conductive layer 18 having a substantially low electromigration rate. The first conductor 18 has an anode region 20, and intermediate region 22 and a cathode region 24. On top of the first conductor 20 is a second conductor including an anode conductor 26 and a cathode conductor 28. The anode electrode 26 lies juxtaposed the anode region 20 and the cathode electrode 28 lies juxtaposed the cathode region 24 of the first conductor 18. A third conductor 30 contacts the first conductor anode region 20 and is separated from anode conductor 26 by the first conductor anode region 20. It should be noted that although the third conductor 30 contacts the bottom side of the first conductor anode region 20 and is juxtaposed the anode conductor 26, the third conductor 30 may contact the lateral side of first conductor anode region 20 while still being not in contact with the anode conductor 26.

The anode conductor 26 includes an anode portion 32 to which are connected source pad 36 and sensor pad 38 at the opposite end of the anode portion 32 from the leading or migrating edge 34. The cathode conductor 28 includes a leading edge 40, a source pad 42 and a sensor pad 44. The third conductor 30 has a sense pad 46. The intermediate portion 22 of the first conductor includes a cathode adjacent region 48 and an anode adjacent region 50. As can be seen from FIG. 2, the width of the cathode conductor 28 at leading edge 40, of the cathode adjacent portion 48 of the intermediate region 22 of the first conductor and of the cathode region 24 of the first conductor are substantially larger than the width of the leading edge 34 of the anode 26, of the anode adjacent portion 50 of the intermediate region 22 of the first conductor and of the anode region 20 of the first conductor. The large width of the cathode regions reduce the current density and thereby minimize electromigration at the cathode of the device. The width at the cathode leading edge 40 can range from equal to the width at the anode leading edge 34 to several times the anode edge width. Thus, in effect, the resistace per unit length of the cathode along the migration axis from the leading edge is substantially greater than the resistance per unit length of the anode conductor.

The sensor of FIGS. 2 and 3 can be used in the following manner. For measuring the velocity of electromigration, an appropriate voltage source is applied to cathode source pad 42 and anode source pad 36 and the rate of change of the resistance between sensor pads 44 and 38 is measured. This rate of change resistance is a function of the electromigration velocity. Similarly, with a voltage applied across cathode source pad 42 and anode source pad 36, the resistance between anode sensor pad 38 and third conductor sensor pad 46 is measured. As the electromigration of the anode conductor 32 migrates from the leading edge 34 past the third conductor 30, there is an abrupt increase in the change of resistance between the anode sense pad 38 and the third conductor sense pad 46. Thus, an electromigration fail warning device is provided.

Using a first conductor of titanium nitride and an anode and cathode conductors of aluminum-copper, the electromigration rate of approximately 4 microns/hour and resistance change of approximately 0.01 ohms/hour. Thus, the resistance between anode and cathode sensor pads 38 and 44 must be low in order to sense the small changes. A resistance of approximately 100 ohms or less is desired.

Although one third conductor 30 is shown, a plurality of additional conductors 30a and 30b are shown in FIG. 2 in phantom connected to a common sensor pad 46 which is enlarged also in phantom. This allows selection of the point at which the electromigration is to be measured as an indication of a fail warning. In actual use, it may be desirable for only one of the fingers 30, 30a and 30b to be used and, thus, the remainder will be disconnected from the sensor pad 46 by for example, laser cutting. Alternatively, more than one conductor finger 30 may be used providing parallel resistances which will give an indication of how far the electromigration has receded from the leading edge 34.

It should be noted that although the cathode adjacent region 48 of the intermediate region 20 of the first conductor 18 is shown as a substantially triangular configuration, others configurations may be used. Similarly, the exact configuration of the cathode conductor 40 and the cathode portion 24 of the first conductor 18 are by way of example and are not limiting. The important factor is that the cathode regions and electrode have a substantially large area to reduce current density. It should also be noted that although titanium nitride was discussed as the metal for use for the first conductor 18, tungsten and titanium tungsten alloys may also be used. Similarly, other metals besides aluminum may be used for example, aluminum alloys having copper, silicon or magnesium dopants in the aluminum film.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:
1. An electromigration sensor comprising:
a first conductor of a first electromigration rate having an anode and cathode regions interconnected by an intermediate region;
an anode conductor having a second electromigration rate higher than said first electromigration rate on said anode region of said first conductor;
a cathode conductor on said cathode region of said first conductor spaced along a migration axis of said first conductor;
a second conductor in contact with said anode region of said first conductor and separated from said anode conductor by said anode region of said first conductor;
electromigration of said anode conductor past said second conductor being detected by a change of resistance between said anode conductor and said second conductor.

2. An electromigration sensor according to claim 1, wherein said anode and cathode conductor are of the same material.

3. An electromigration sensor according to claim 1, wherein the portion of said second conductor in contact with said first conductor is juxtaposed said anode conductor.

4. An electromigration sensor according to claim 1, wherein said second conductor includes a plurality of fingers in contact with said first conductor at a plurality of areas along said anode region of said first conductor and separated from said anode conductor by said first conductor.

5. An electromigration sensor according to claim 4, wherein said second conductor includes a contact pad interconnecting said plurality of fingers.

6. An electromigration sensor according to claim 1, wherein the width of said cathode conductor adjacent said intermediate region of said first conductor is substantially greater than the width of said anode conductor adjacent said intermediate region of said first conductor.

7. An electromigration sensor according to claim 6, wherein the width of said intermediate region of said first conductor adjacent said cathode region is greater than the width of said intermediate region adjacent said anode region.

8. An electromigration sensor according to claim 1, wherein said sensor has an axis of electromigration, and said anode conductor has a greater resistance per unit of length along said axis than said cathode conductor extending from said intermediate region of said first conductor.

9. An electromigration sensor according to claim 1, including a pair of source pads connected to said anode conductor and said cathode conductor and a pair of sensing pads connected to said anode and cathode respectively, migration velocity being determined by measuring the change of resistance between said sensing pads with a voltage applied across said source pads.

10. An electromigration sensor comprising:
a first conductive layer having a first electromigration rate and divided into an anode region, a cathode region and an intermediate region;

a second conductive layer having a second electromigration rate greater than said first electromigration rate and divided into an anode region and a cathode region on said anode and cathode regions of said first layer and spaced along a migration axis of said intermediate region of said first layer;

the width of said cathode regions adjacent said intermediate region is greater than the width of said anode regions adjacent said intermediate region and transverse to said migration axis.

11. An electromigration sensor according to claim 10, wherein said intermediate region of said first layer includes a first portion adjacent said cathode regions having a greater width transverse to said migration axis than the width transverse to said migration axis of a second portion of said intermediate region adjacent said anode regions.

12. An electromigration sensor according to claim 10, wherein said second layer includes source pads and sensor pads extending from said anode and cathode regions of said second layer, migration velocity being determined by measuring the change of resistance between said sensing pads with a voltage applied across said source pads.

13. An electromigration sensor according to claim 12, including a third conductive layer engaging said anode region of said first layer between said intermediate region of said first layer and said source and sensor pads of said anode region of said second layer and separated from said anode region of said second layer by said first layer, electromigration of said anode region of said second layer past said third layer being detected by a rapid change of resistance between said anode sensing pad and said third conductor.

* * * * *